(12) United States Patent
Gunnam

(10) Patent No.: US 10,445,199 B2
(45) Date of Patent: Oct. 15, 2019

(54) BAD PAGE MANAGEMENT IN STORAGE DEVICES

(71) Applicant: Western Digital Technologies, Inc., Irvine, CA (US)

(72) Inventor: Kiran Kumar Gunnam, Milpitas, CA (US)

(73) Assignee: Western Digital Technologies, Inc., San Jose, CA (US)

(*) Notice: Subject to any disclaimer, the term of this patent is extended or adjusted under 35 U.S.C. 154(b) by 342 days.

(21) Appl. No.: 15/388,883

(22) Filed: Dec. 22, 2016

(65) Prior Publication Data

US 2018/0181476 A1  Jun. 28, 2018

(51) Int. Cl.
| | | |
|---|---|---|
| *G06F 11/00* | (2006.01) | |
| *G06F 11/20* | (2006.01) | |
| *G06F 3/06* | (2006.01) | |

(52) U.S. Cl.
CPC .......... *G06F 11/2094* (2013.01); *G06F 3/064* (2013.01); *G06F 3/0619* (2013.01); *G06F 3/0659* (2013.01); *G06F 3/0665* (2013.01); *G06F 3/0673* (2013.01)

(58) Field of Classification Search
CPC .......... G06F 17/3033; G06F 17/30333; G06F 17/30336; G06F 17/30982; G06F 12/0246; G06F 2212/7201; G11C 11/5628; G11C 11/5621; G11C 16/16; G11C 16/349; G11C 16/344
See application file for complete search history.

(56) References Cited

U.S. PATENT DOCUMENTS

| | | | |
|---|---|---|---|
| 7,009,896 B2 | 3/2006 | Yoon et al. | |
| 7,603,593 B2 | 10/2009 | Iaculo et al. | |
| 7,690,031 B2 | 3/2010 | Ma et al. | |
| 8,239,714 B2 | 8/2012 | Flynn et al. | |
| 8,392,647 B2 | 3/2013 | Lee et al. | |
| 8,688,954 B2 | 4/2014 | Davis | |

(Continued)

FOREIGN PATENT DOCUMENTS

| | | |
|---|---|---|
| CN | 103106125 A | 5/2013 |
| WO | 2015/116133 A2 | 8/2015 |

OTHER PUBLICATIONS

AN1819; Application Note; Bad Block Management in NAND Flash Memories; dated May 2004; 7 total pages.

*Primary Examiner* — Bryce P Bonzo
*Assistant Examiner* — Jeison C Arcos
(74) *Attorney, Agent, or Firm* — Patterson & Sheridan, LLP; Steven H. Versteeg

(57) ABSTRACT

The present disclosure generally relates to methods for managing bad pages in storage devices. When a page is bad or faulty, a spare page is used to store the data because the bad or faulty page is unreliable for data storage. When the time comes to read the data from the bad page or write data onto the page, there needs to be some direction to the spare page. The bad or faulty page may contain a pointer to direct to the location of the spare page or metadata containing directions to the location of the spare page. A hash function may be used to calculate that the stored data in the bad or faulty page is incorrect and, once decoded, provide direction to the spare page. By using pointers, metadata or hash functions, additional data tables are unnecessary and data storage is more efficient.

19 Claims, 8 Drawing Sheets

(56) References Cited

U.S. PATENT DOCUMENTS

| | | | |
|---|---|---|---|
| 8,902,653 B2* | 12/2014 | Radke | G11C 11/5628 365/185.09 |
| 2002/0013924 A1* | 1/2002 | Yamamoto | G06F 11/1008 714/763 |
| 2006/0018166 A1* | 1/2006 | Iaculo | G11C 29/76 365/200 |
| 2006/0031710 A1* | 2/2006 | Jo | G06F 12/0246 714/5.1 |
| 2006/0109725 A1* | 5/2006 | Yoon | G06F 12/0246 365/200 |
| 2007/0076497 A1* | 4/2007 | Chae | G11C 7/1027 365/207 |
| 2007/0089034 A1* | 4/2007 | Litsyn | G06F 11/1072 714/763 |
| 2008/0282132 A1* | 11/2008 | Egner | G06F 11/1008 714/785 |
| 2009/0013148 A1* | 1/2009 | Eggleston | G06F 12/0246 711/203 |
| 2009/0198886 A1* | 8/2009 | Balakrishnan | G06F 3/0625 711/114 |
| 2009/0259799 A1* | 10/2009 | Wong | G06F 12/0207 711/103 |
| 2010/0030945 A1* | 2/2010 | Yuan | G06F 12/0246 711/103 |
| 2010/0217953 A1* | 8/2010 | Beaman | G06F 17/3033 711/216 |
| 2010/0287171 A1* | 11/2010 | Schneider | G06F 17/30864 707/759 |
| 2010/0293332 A1* | 11/2010 | Krishnaprasad | G06F 12/0813 711/119 |
| 2010/0332751 A1* | 12/2010 | Quigley | H04L 63/0428 711/114 |
| 2011/0029742 A1* | 2/2011 | Grube | G06F 9/4401 711/154 |
| 2011/0041005 A1* | 2/2011 | Selinger | G06F 11/10 714/719 |
| 2011/0055458 A1* | 3/2011 | Kuehne | G06F 12/0246 711/103 |
| 2011/0066793 A1* | 3/2011 | Burd | G06F 11/1028 711/103 |
| 2011/0202744 A1* | 8/2011 | Kulkarni | G06F 12/1018 711/216 |
| 2013/0039129 A1* | 2/2013 | Radke | G11C 11/5628 365/185.09 |
| 2013/0042060 A1* | 2/2013 | Marukame | G06F 17/30982 711/108 |
| 2013/0111187 A1* | 5/2013 | Liu | G06F 3/0614 711/216 |
| 2014/0189053 A1* | 7/2014 | Shi | H04L 67/10 709/217 |
| 2014/0237287 A1* | 8/2014 | Burd | G06F 11/1028 714/6.24 |
| 2014/0245106 A1* | 8/2014 | Leininger | G06F 11/1016 714/764 |
| 2014/0279946 A1* | 9/2014 | Scarpino | G06F 17/30371 707/691 |
| 2016/0357634 A1* | 12/2016 | Wang | G06F 3/0617 |
| 2018/0336139 A1* | 11/2018 | Rao | G06F 12/0871 |

* cited by examiner

BAD PAGE MANAGEMENT IN STORAGE DEVICES

BACKGROUND OF THE DISCLOSURE

Field of the Disclosure

Embodiments of the present disclosure generally relate to methods for managing bad pages in storage devices.

Description of the Related Art

In storage class memory (SCM), bad or faulty pages in the storage device need to be remapped on a periodic basis. To remap the pages, a table based method is traditionally utilized whereby very expensive tables are consulted to compare the stored data to the table. The table sizes are proportional to the number of pages. Thus, if there are $2^{32}$ pages in SCM with an assumed one percent of pages needing to be remapped, each remapping will have thirty-two bits for the original physical bit address (PBA) and thirty-two bits for the new PBA. This storage spaces needs an additional 343 GB DRAM to store the tables and one percent spare space of the storage device. Also, the 343 GB tables have to be stored to the non-volatile memory (NVM) device which occupies 0.125 percent of the memory device space. With three times replication, the percentage increases to 0.375 percent of the storage device space. Maintaining such a big table in DRAM and syncing to NVM in the case of power failure is near impossible.

If remapping the blocks by treating a block as a group of an arbitrary amount of pages, then if there are any faulty pages in the block, a significant amount of additional storage space is needed.

What is needed is a manner to manage bad or faulty pages without using tables.

SUMMARY OF THE DISCLOSURE

The present disclosure generally relates to methods for managing bad pages in storage devices. When a page is bad or faulty, a spare page is used to store the data because the bad or faulty page is unreliable for data storage. When the time comes to read the data from the bad page or write data onto the page, there needs to be some direction to the spare page. The bad or faulty page may contain a pointer to direct to the location of the spare page or metadata containing directions to the location of the spare page. A hash function may be used to calculate that the stored data in the bad or faulty page is incorrect and, once decoded, provide direction to the spare page. By using pointers, metadata or hash functions, additional data tables are unnecessary and data storage is more efficient.

In one embodiment, a method comprises: receiving a request to read storage data from a storage page of a memory device, the storage page having the storage data and parity data; reading the parity data from the storage page; determining that the parity data indicates the storage page is faulty; reading the storage data, wherein the storage data contains an embedded pointer; decoding the storage data to determine the spare page location; and reading data from the spare page location. A computer system for storing and retrieving files is also disclosed where the computer system comprises a processor; and a memory system storing instructions that, when executed by the processor, cause the computer system to perform the method. A non-transitory computer readable storage medium is also disclosed that contains instructions that, when executed by a processor, cause a computer system to perform the method.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. However, it should be understood that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

The present disclosure generally relates to methods for managing bad pages in storage devices. When a page is bad or faulty, a spare page is used to store the data because the bad or faulty page is unreliable for data storage. When the time comes to read the data from the bad page or write data onto the page, there needs to be some direction to the spare page. The bad or faulty page may contain a pointer to direct to the location of the spare page or metadata containing directions to the location of the spare page. A hash function may be used to calculate that the stored data in the bad or faulty page is incorrect and, once decoded, provide direction to the spare page. By using pointers, metadata or hash functions, additional data tables are unnecessary and data storage is more efficient.

The term "user" as used herein includes, for example, a person or entity that owns a computing device or wireless device; a person or entity that operates or utilizes a computing device or a wireless device; or a person or entity that is otherwise associated with a computing device or a wireless device. It is contemplated that the term "user" is not intended to be limiting and may include various examples beyond those described.

The term "media item" as used herein includes, for example, computer files, data, images, photos, documents, other such electronic media, and other resources for storing information, which is available to a computer program and which may be based on some type of durable storage.

Figure 1:
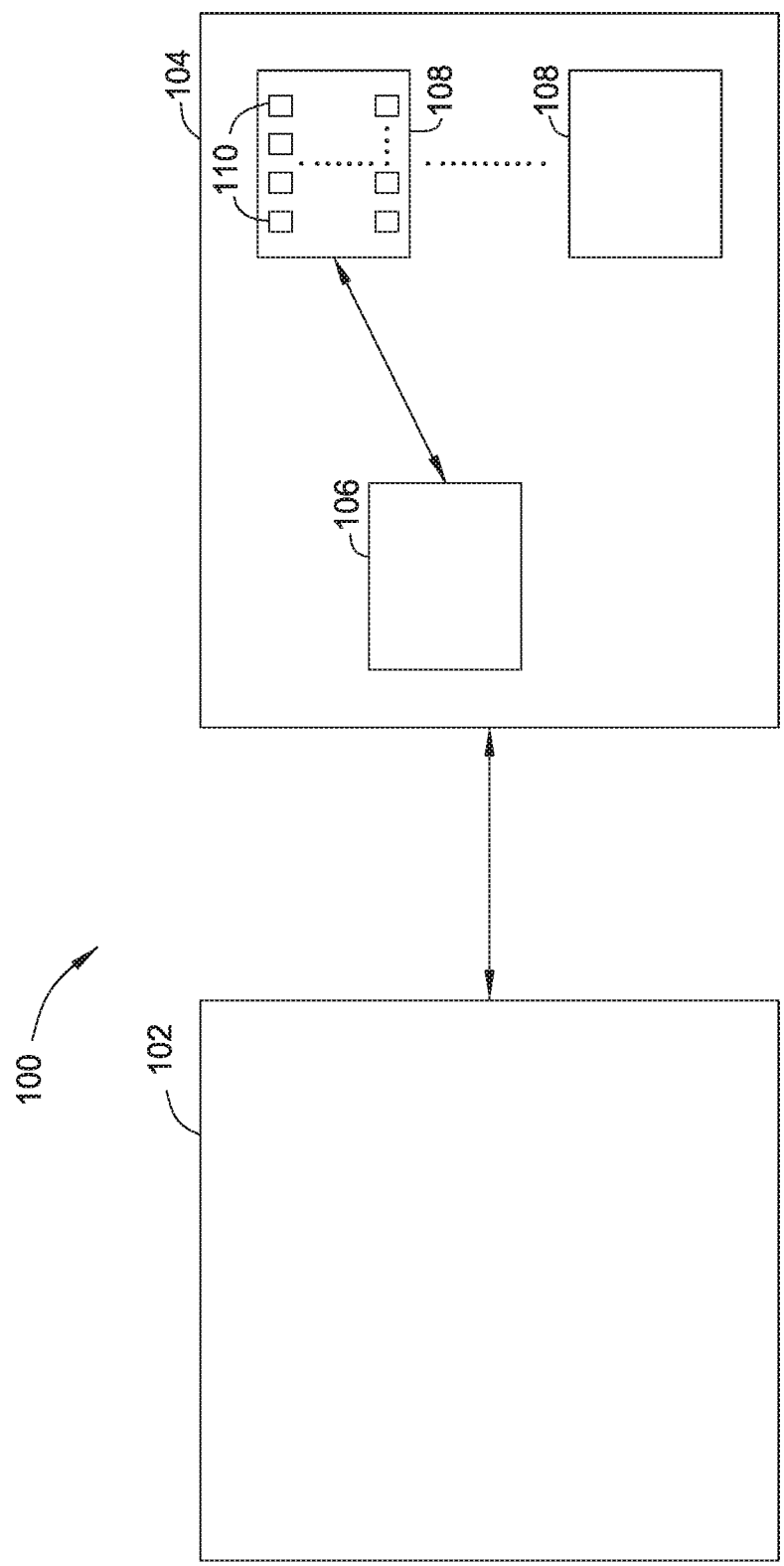
FIG. 1 is a schematic illustration of a computing system according to one embodiment.

FIG. 1 is a schematic illustration of a computing system 100 according to one embodiment. The computing system 100 includes a host device 102 and a memory system 104. The memory system 104 includes a scheduler 106 that communicates with numerous memory devices 108. Each memory device 108 includes a plurality of memory locations 110. The host device 102 communicates with the memory system 104 by requesting data to be written to a memory location 110 in the memory system 104. Alternatively, the host device 102 requests data to be read from a memory location 110 in the memory system 104. The memory system 104 communicates the read data back to the host device 102 and also communicates a confirmation of writing to the host device 102 as appropriate.

Figure 2:
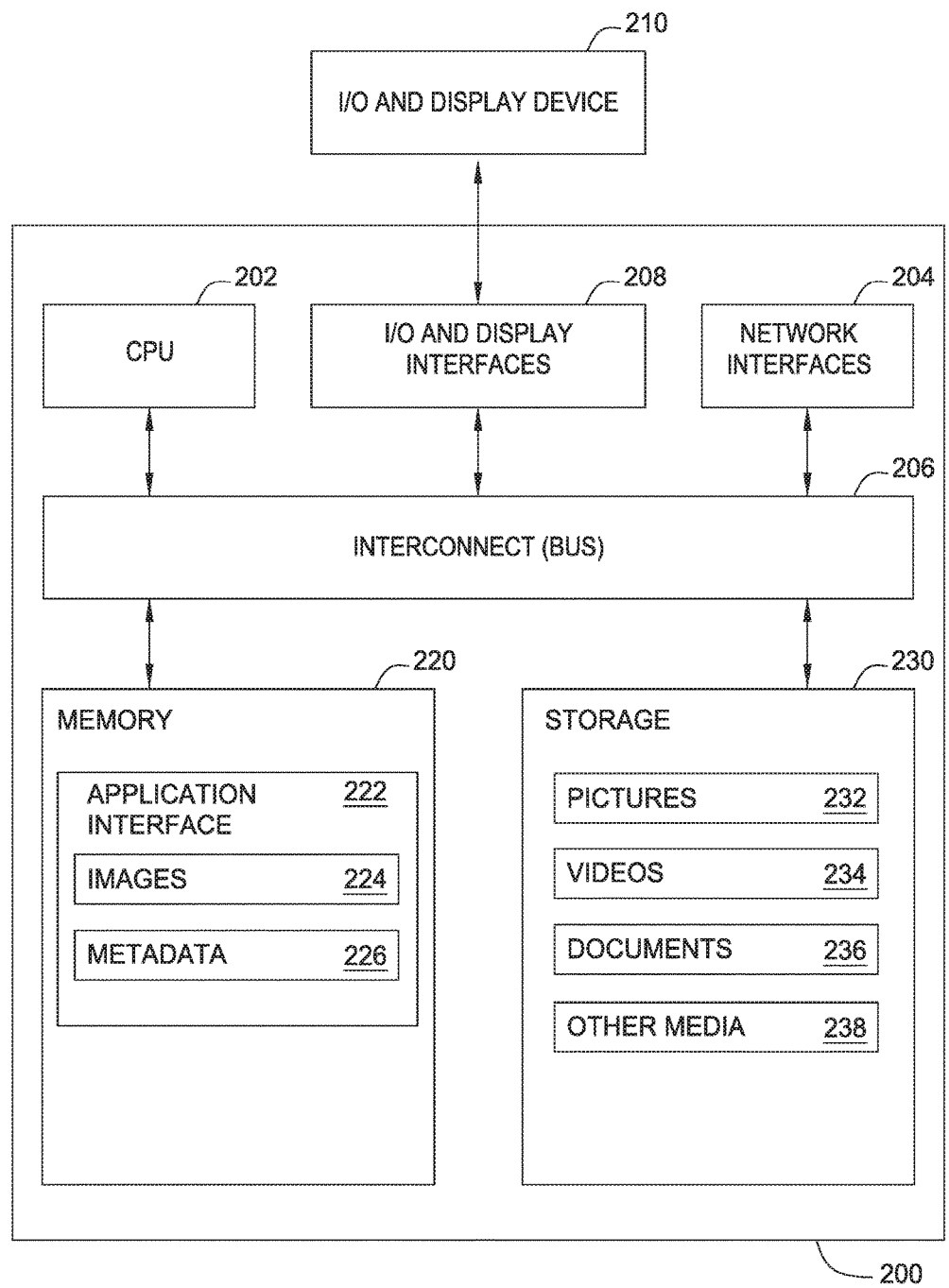
FIG. 2 illustrates an individual user computing system having a host device used to access a memory system, according to embodiments described herein.

FIG. 2 illustrates an individual user computing system 200 having a host device used to access a memory system, according to embodiments described herein. The user computer 200 may include, without limitation, a central processing unit (CPU) 202, a network interface 204, an interconnect 206, a memory 220, and additional storage 230 such as a memory array. The user computer 200 may also include an I/O device interface 208 connecting I/O devices 210 (for example, keyboard, display, touchscreen, and mouse devices) to the user computer 200.

CPU 202 is included to be representative of a single CPU, multiple CPU's, a single CPU having multiple processing cores, etc., and the memory 220 is generally included to be representative of a random access memory. The interconnect 206 may be used to transmit programming instructions and application data between the CPU 202, I/O device interfaces 208, storage 230, network interface 204, and memory 220. The network interface 204 may be configured to transmit data via the memory system 104, for example, to stream, upload/download or otherwise access content. Storage 230, such as a hard disk drive or solid-state storage drive (SSD), may store non-volatile data. The storage 230 may contain pictures 232, videos 234, documents 236, and other media 238. Illustratively, the memory 220 may include an application interface 222, which itself may display images 224, and/or store metadata 226 of images 224.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

The present example also relates to an apparatus for performing the operations herein. This apparatus may be specially constructed for the illustrated purposes, or it may comprise a general purpose computer selectively activated or reconfigured by a computer program stored in the computer. Such a computer program may be stored in a computer readable storage medium, such as, but is not limited to, read-only memories (ROMs), random access memories (RAMs), EPROMs, EEPROMs, flash memory, magnetic or optical cards, any type of disk including floppy disks, optical disks, CD-ROMs, and magnetic-optical disks, or any type of media suitable for storing electronic instructions, and each coupled to a computer system interconnect.

The structure for a variety of these systems will appear from the description above. In addition, the present examples are not described with reference to any particular programming language, and various examples may thus be implemented using a variety of programming languages.

In dealing with bad or faulty pages, numerous manners may be utilized to ensure the data is retrievable. One manner is through tables as discussed above, but the tables require a significant amount of storage space. Assuming the entire page is not bad or faulty (i.e., at least some data can be accurately stored on the page), then the page can still be used to contain some data such as directions or an address to a spare page. By having directions or an address to a spare page, the data may still be found. Specifically, the initial location for the data can still be the first location checked for the data, but then, rather than finding the correct data (or bad data) at the first location, directions or an address to the location of the correct data is placed in the bytes of the first location that can store data. Upon reading the address, the data is then gathered from the spare page that contains the correct data.

One manner to deal with bad or faulty pages is to use embedded pointers to provide a map/directions/address to the spare page. The address of the spare page is stored as an embedded pointer with increased error correction coding. To ensure that the spare page contains the correct data, the spare page stores the meta data of the bad page address so that two way checking occurs. Embedded pointers can be utilized without the need for additional tables for the bad/faulty page management. The amount of spare pages that need to be allocated is close to the optimal value of total spare pages. For example, for a page failure rate of x=1%, the amount of spare space needed is calculated by $(x+y)\% = (1+y)\%$ where y is the page failure rate such that a page cannot hold any partial information. If y=0, then no tables are needed. If $y=1e^{-6}$, for example, then the bad page table management is in the KB range (rather than GB as discussed above) and thus manageable. Utilizing embedded pointers involves having a first read of the original bad/faulty page and then, after reading the address, reading from the spare page. For writing using embedded pointers, a read verify process first occurs to ensure conflict free writing followed by the write and then a read verify.

The theory of the embedded pointer is that the page isn't completely bad for containing data and thus, by placing a lot of duplication of data in the page (i.e., the location where the data can be found in a spare page), the page can be identified as faulty and the read address for the spare page can be obtained.

In order to use embedded pointers, a failed PBA is remapped to a working PBA so long as the failed PBA can still hold some data, though the data stored in the failed PBA will have a lot of errors. The failed PBA needs to hold sufficient data to be able to direct to the spare page. It is important to note that a PBA with all "0" for the addresses will not be used as spare mapping addresses. To utilize embedded pointers, an initial write is performed to a partially working PBA. In a 8+1+1 configuration (i.e., 8 dies of data, 1 die of parity data and 1 die of ECC data), each die stores 8 bytes of a codeword. The bad/faulty page is marked such that all of the parity bits are set to "0", raid parity bits are set to "0" and bytes of the spare page address are stored using a repetition coding of (1,16). One possible scheme for implementing the repetition coding is shown in Table I.

TABLE I

|  | Byte 1 | Byte 2 | Byte 3 | Byte 4 | Byte 5 | Byte 6 | Byte 7 | Byte 8 |
|---|---|---|---|---|---|---|---|---|
| Die 0 | Byte 0 of PBA_Spare | Byte 1 of PBA_Spare | Byte 2 of PBA_Spare | Byte 3 of PBA_Spare | Byte 0 of PBA_Spare | Byte 1 of PBA_Spare | Byte 2 of PBA_Spare | Byte 3 of PBA_Spare |
| Die 1 | Byte 0 of PBA_Spare | Byte 1 of PBA_Spare | Byte 2 of PBA_Spare | Byte 3 of PBA_Spare | Byte 0 of PBA_Spare | Byte 1 of PBA_Spare | Byte 2 of PBA_Spare | Byte 3 of PBA_Spare |
| Die 2 | Byte 0 of PBA_Spare | Byte 1 of PBA_Spare | Byte 2 of PBA_Spare | Byte 3 of PBA_Spare | Byte 0 of PBA_Spare | Byte 1 of PBA_Spare | Byte 2 of PBA_Spare | Byte 3 of PBA_Spare |
| Die 3 | Byte 0 of PBA_Spare | Byte 1 of PBA_Spare | Byte 2 of PBA_Spare | Byte 3 of PBA_Spare | Byte 0 of PBA_Spare | Byte 1 of PBA_Spare | Byte 2 of PBA_Spare | Byte 3 of PBA_Spare |
| Die 4 | Byte 0 of PBA_Spare | Byte 1 of PBA_Spare | Byte 2 of PBA_Spare | Byte 3 of PBA_Spare | Byte 0 of PBA_Spare | Byte 1 of PBA_Spare | Byte 2 of PBA_Spare | Byte 3 of PBA_Spare |
| Die 5 | Byte 0 of PBA_Spare | Byte 1 of PBA_Spare | Byte 2 of PBA_Spare | Byte 3 of PBA_Spare | Byte 0 of PBA_Spare | Byte 1 of PBA_Spare | Byte 2 of PBA_Spare | Byte 3 of PBA_Spare |
| Die 6 | Byte 0 of PBA_Spare | Byte 1 of PBA_Spare | Byte 2 of PBA_Spare | Byte 3 of PBA_Spare | Byte 0 of PBA_Spare | Byte 1 of PBA_Spare | Byte 2 of PBA_Spare | Byte 3 of PBA_Spare |
| Die 7 | Byte 0 of PBA_Spare | Byte 1 of PBA_Spare | Byte 2 of PBA_Spare | Byte 0 of PBA_Spare | Byte 0 of PBA_Spare | Byte 1 of PBA_Spare | Byte 2 of PBA_Spare | Byte 3 of PBA_Spare |
| Die 8 | 0x00 | 0x00 | 0x00 | 0x00 | 0x00 | 0x00 | 0x00 | 0x00 |
| Die 9 | 0x00 | 0x00 | 0x00 | 0x00 | 0x00 | 0x00 | 0x00 | 0x00 |

To obtain the information from the page shown in Table I, a read is initially performed to determine that the page is faulty. The parity data provides the key to determining whether the page is faulty. Reading all "0" from the parity data indicates that the page is faulty. Then, a read is performed to check whether an embedded pointer can be retrieved from the bad/faulty page using the majority decoding. Additionally, if ECC decoding is performed on the data, the decoding fails by the design and constraints put in place for the bad page. Therefore, ECC decoding failure serves as an additional indicator of the bad page. The faulty address is stored as well as part of the meta data of the allocated spare page. Die 8 (i.e., parity die) and Die 9 (i.e., ECC die) are the signature to show that the page is a faulty page. The information that is in Dies 0-7 are the embedded pointer that provides the address of the spare page where the data that was expected to be in Dies 0-7 may be found.

If the entire page is faulty such that none of Dies 0-7 can be used, then each byte of Dies 0-7 is written as "1" and all bytes in Die 8 are written as "0". A dedicated table is maintained for the completely unusable pages because there is no way an embedded pointer can be stored in a completely unusable page. The number of completely unusable pages would be small. For example, if 1 in 1 million pages is completely unusable, then a memory of 4.3 k entries for the remapping table for a SCM with $2^{32}$ PBA would be needed. The bad page can be implemented as a content addressable memory (CAM) to speed up the access. If a factory repair mechanism is available that can be used by a controller in the field, the repair mechanism could be used without the need of maintaining a completely bad page table. The repair can be performed on a periodic basis such that the size of the table to be maintained is even smaller.

A read process for embedded pointers involves a physical address translation from a logical address using a wear-leveling network. The read is sent to the physical address and checked for BCH errors and then the parity check is performed to see if there are any embedded pointers. While the physical address is read, the physical address is checked against a bad physical page table to see if the incoming physical address should be discarded and then a new read is performed on the remapped physical address. If there is an embedded pointer, the new read is issued to the embedded physical address. For a write process, a read is performed prior to writing to see if there is an embedded pointer. If there is an embedded pointer indicating a faulty page, the write is not performed on the faulty page. If the write can be performed, a read verify is performed to make sure the data (or embedded pointer if the page is a faulty page) is correctly written.

Figure 3:
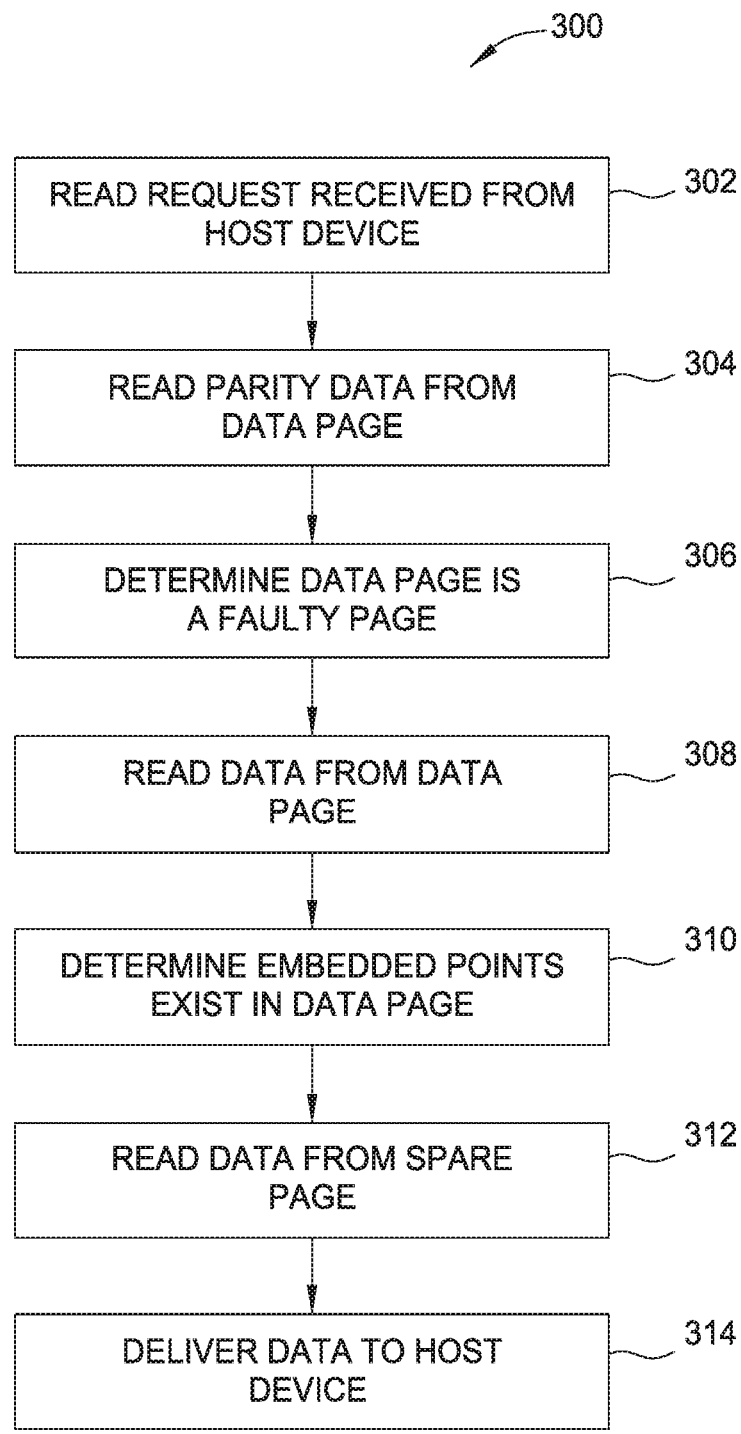
FIG. 3 is a flow chart illustrating a read process relying upon embedded pointers.

FIG. 3 is a flow chart 300 illustrating a read process relying upon embedded pointers. Initially, the host device 102 sends a read request to the memory system 104 in block 302. The memory system 104 then determines the memory device 108 that has the information and the scheduler 106 then schedules the reading. The memory system 104 then proceeds with reading the page where the data is located in the memory device 108. The memory system 104 first reads the parity data on the page in block 304. In reading the parity data, the memory system 104 reads all "0"s in the parity data and thus determines that the data page is a faulty or bad page in block 306. Optionally, the ECC data can be read to also determine or confirm that the data page is faulty. At this point, it is not clear if the data page contains any relevant data. All that is known is that the data page is faulty. Therefore, the memory system 104 continues to read the data page in block 308. Upon reading the data page, the memory system 104 determines that the data page contains an embedded pointer that has the address of the spare page in block 310. The spare page is the location where the data that was supposed to be found in the data page is now correctly stored. The memory system 104 then looks to the spare page and reads the data from the spare page in block 312. In reading the data from the spare page, the memory system 104 checks the parity data and ECC data to confirm that the data is correct. Additionally, the spare page contains may contain meta data to confirm that the data found in the spare page is the data that was supposed to be in the data page. Finally, the memory system 104 delivers the read data to the host device 102 in block 314.

Figure 4:
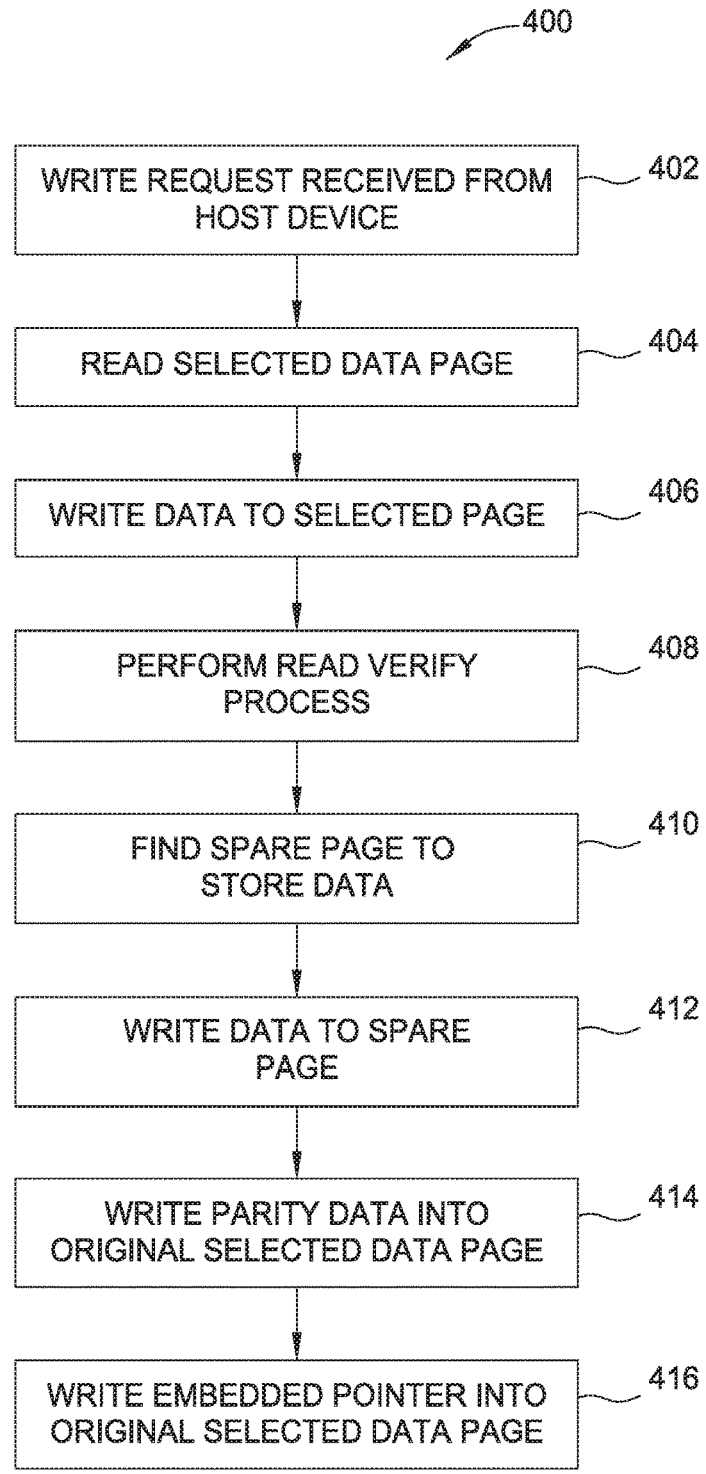
FIG. 4 is a flow chart illustrating a write process relying upon embedded pointers.

FIG. 4 is a flow chart 400 illustrating a write process relying upon embedded pointers. The write process begins when the host device 102 sends a write request to the memory system 104 and the memory system 104 receives the write request in block 402. The memory system 104 determines which memory device 108 to write the data to and, specifically, which data page will hold the data. The memory device then reads the selected data page in block 404. The read process is performed before writing to make sure the selected data page does not contain an embedded pointer in a faulty page. If the write occurs first, then an embedded pointer may be lost and hence, data lost. Assuming the read results in a determination that no embedded pointer is present, the data is written to the page in block 406. A read verify is then performed in block 408 to determine if the write was successful. Assuming the read verify results in a determination that the write was successful, then the write process is over. If, however, the read verify results in a determination that the selected page is faulty but still usable, then, the memory system 104 finds a spare page to use for writing the data in block 410. Similar to the selected page, the spare page is then read to determine if the spare page contains an embedded pointer. Assuming the spare page does not have an embedded pointer, then the data is written to the spare page in block 412 including the parity data, ECC data and, optionally, meta data confirming that the data stored in the spare page is the data that was supposed to be stored in the originals elected page. A read verify process is performed on the spare page to confirm that the data is written correctly. Back at the originally selected page, the parity data and optionally the ECC data are written with all "0"s to indicate that the selected page is a faulty page in block 414. The address of the spare page is then written into the data for the selected page so that an embedded pointer is now present in the selected page in block 416. A read verify is then performed on the original selected page to confirm that the embedded pointer is present.

By using embedded pointers, bad or faulty pages can still be used to provide directions to a spare page where the desired data may be found. The embedded pointers, by simply storing the address in the originally selected data page, do not necessitate the use of tables and therefore diminishes the need for tables in the storage devices.

Another manner to avoid using tables is using a hash function. By using a hash function, a plurality of pages in SCM are grouped as a block. The faulty pages are remapped to spare pages using one of several hash functions. The spare pages contain the meta data that indicates which faulty page is mapped to that specific spare page. The latency for good pages is a one page access, while the latency for pages in a block with one page error or more is variable and depends upon the number of hash functions that need to be used. Deterministic mapping of bad pages can be used and does not require memory to store the mappings. The mapping can be used for both block storage and NV-DIMM.

If a factory repair/fuse mechanism is available to remap the defective pages, then such a mechanism would be desirable as the mapping would be transparent to the memory system controller so that the controller does not need to maintain any state as the resulting mappings would be contiguous in the physical memory space. For example, if page 2 is a faulty page, a fuse mechanism switches bad page 2 with another good spare page. If the fuse option doesn't work, however, then the hash functions will be a good option.

To utilize hash functions and avoid using tables, initially a set of contiguous spare pages are allocated for remapping defective pages. The addresses for the spare area will start from $2^{32}$ if the drive size is $2^{32}$. The spare area is not mapped to any logical block addressing (LBA) initially, and divided word line (DWL) output does not cover the address space. Having a contiguous set (or easily computable address sequences) of spare locations provides an assumption of the available spare locations. In all instances of using hash functions, a read process always occurs before the write process, and bad pages will be detected and mapped during the write or read process.

When a bad or faulty page is encountered for the first time during a write or failed read, the bad page is mapped using a first hash function to a spare page. Before allocating a spare page to a failed PBA, the spare page is read to verify that no other PBA is allocated to the spare page. During allocation of spare PBA, meta data will be added of which PBA is mapped to the spare location. If there is a conflict due to the hash function which is detected as part of the read verify process, a second hash function (different from the first hash function) is applied to remap to a different spare PBA address. If there is a conflict with the second hash function, then a third hash function is applied. Additional hash function can be applied as necessary based upon conflicts.

Since no table is maintained, initial access will always be to the bad page. The read of the bad page will result in an error and thus a hash function is computed for the incoming read address. A special access is tried (i.e., a read verify before writing to confirm the correct mapping) to the PBA pointed to by the hash function. For all incoming accesses, the hash function can be computed as part of the pre-computation. If an error from the original location is detected, then the read is redirected to access the PBA pointed out by the hash function. If the read out spare PBA pointed out by the first hash function is not the intended PBA, then a second hash function is applied. The process can be repeated by applying other hash functions until the intended PBA is found. If it is assumed that there are $2^{32}$ pages in total with a page failure rate of 1%, then there are k pages ($225<k<2^{26}$) pages that have to be remapped. In one embodiment, since the SCM's memory needs to have 33 bits to be able to address the spare pages, all of the hash functions output map (though mapped differently) can be designed to the same spare space. With this, spare capacity is allocated dynamically without any pre-allocations. While space efficient, such a technique leads to long latency. In another embodiment, a dedicated spare space can be allocated in decreasing order of size for the higher order hash functions. The decreasing order of size improves latency by cutting down the number of conflicts of mapped outputs of different has functions.

Figure 5:
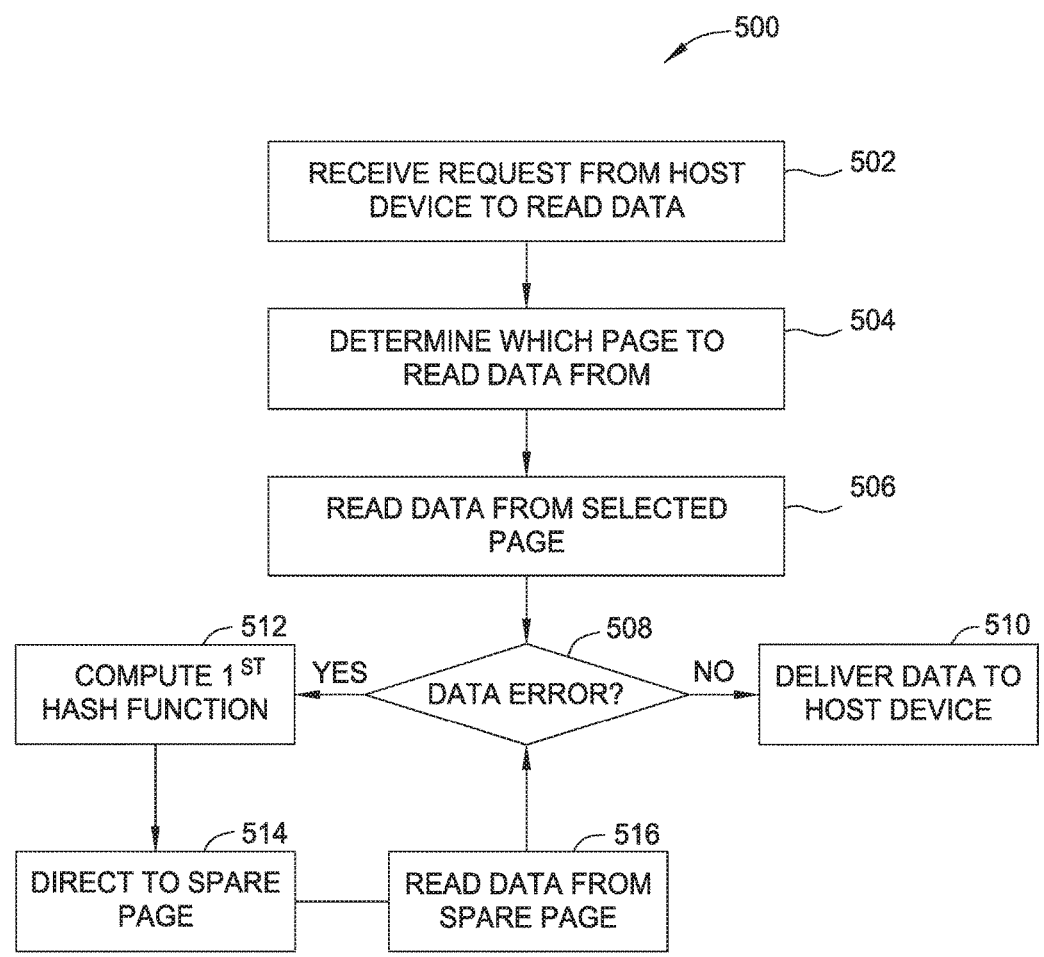
FIG. 5 is a flow chart illustrating a read process using hash functions according to one embodiment.

FIG. 5 is a flow chart 500 illustrating a read process using hash functions according to one embodiment. The read process starts when a read request is received by the memory system 104 from the host device 102 in block 502. The memory system 104 then determines which page the data should be read from in block 504. The selected page is then read in block 506. A determination is then made in block 508 regarding whether the data is in error. If there is no error, then the data is read and then delivered to the host device 102 in block 510. If there is a data error, then a first hash function is computed in block 512. The first hash function provides a map to a spare page to find the data. The memory system 104 then is directed to the spare page in block 514. The data is then read on the spare page in block 516. Then, a determination is made as to whether there is a data error in block 508. The read process continues until there is no data error and the data can be delivered to the host device 102. In each case, either the data is correct on the page being read or a hash function can be computed that directs the read to be performed at another page that may have the correct data.

Figure 6:
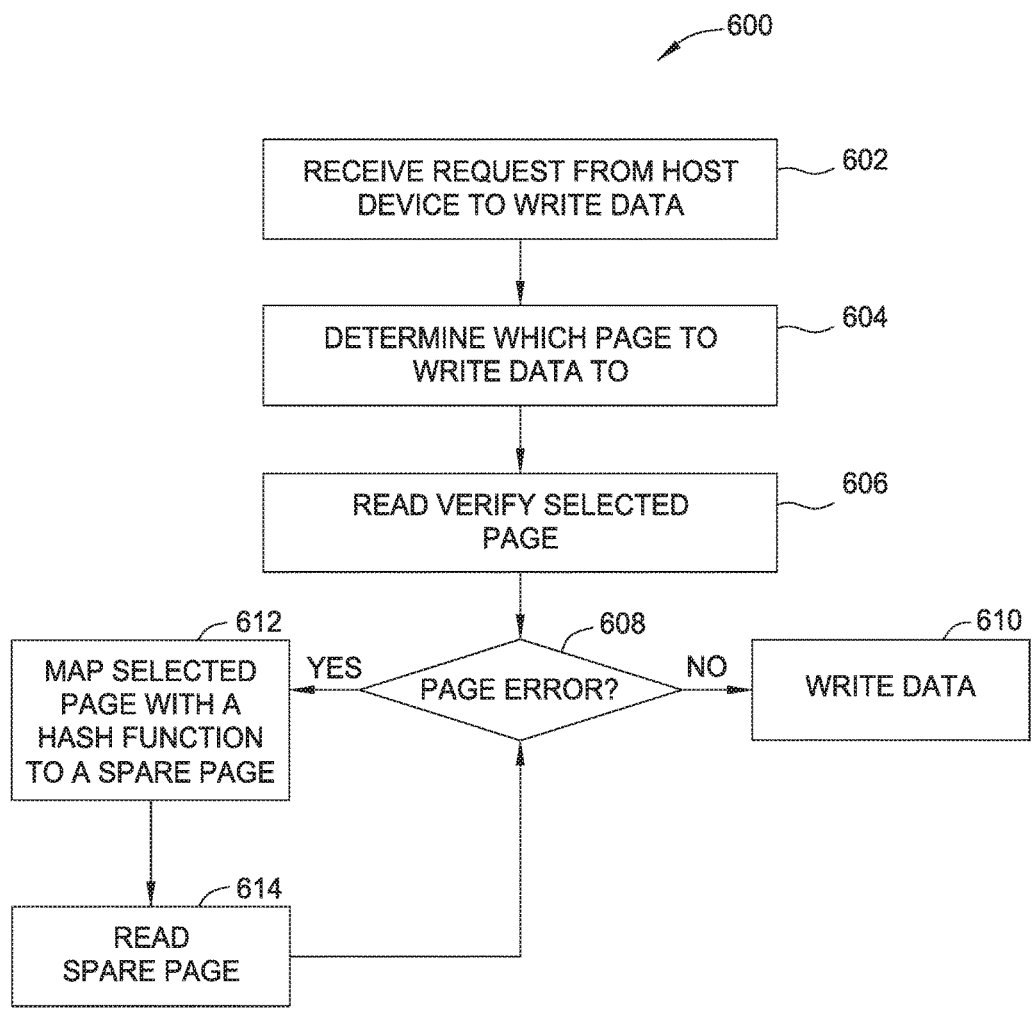
FIG. 6 is a flow chart illustrating a write process using hash functions according to one embodiment.

FIG. 6 is a flow chart 600 illustrating a write process using hash functions according to one embodiment. The process starts when a write request is received from the host device 102 in block 602. The memory system 104 then determines to which page the data to should be written in block 604. The selected page is then read to verify that the selected page is not a faulty page or already allocated to other data in block 606. Assuming the page is not already allocated to other data, then a determination is made in block 608 as to whether the page is a faulty page. If the page is not a faulty page, then the data may be written to the page in block 610. If the page is a faulty page, then the faulty page is mapped with a hash function to a spare page in block 612. The spare page is then read in block 614, and then a determination is made as to whether the spare page is a faulty page in block 608. Prior to mapping, a determination is made regarding which spare page to utilize so that the mapping is not made to a page already allocated to other data. When a page is already allocated to other data, then there is no room to place a hash function in the already allocated spare page. Therefore, a determination as to whether a spare page is available is made prior to mapping.

Another manner to avoid using tables is to utilize meta data. For this situation, a plurality of pages are grouped as a block. For the first predetermined number of bad pages from each block, those pages are mapped and meta data is stored in those pages that is easily addressed by the block address. If a block has more than the predetermined number of bade pages, the entire block is remapped to a spare block. Each spare page has additional meta data indicating which bad page is mapped thereto. Additionally, the meta data related to all of the bad page mappings and bad block mappings for a block are stored as part of the meta page of a block.

For SCM with a page failure rate of 1%, for a situation where there are 128 pages with a maximum amount of permitted bad pages of 5, the minimum total spare space that has to be allocated is 1.4% of the total memory. Such a situation balances the spare space that needs to be allocated in a fixed amount for bad pages and spare pages that need to be allocated dynamically for bad blocks. 1.4% is 30 times less than a block based management situation. For instance, having 36% spare requirement increases the cost of SCM by around 64%. Additionally, the 343 GB DRAM discussed above is not needed for page level management.

Latency for good pages is one page access, and latency for pages in a block with one or more errors needs two page access (i.e., meta page access followed by the mapped page) or three page access (i.e., access to the regular page that is failed, metal page access followed by the mapped page). Therefore, latency is bounded.

An example for the mapping involves utilizing the first five fields (with each field having 33 bits). The first five fields are used because, as noted above, the maximum amount of bad pages is predetermined and set to 5. In the first field, there is meta data for the block. If the meta data is "1", then the next 18 bits indicate the destination block address within spare blocks. If the meta data is "0", then the next 33 bits represent the meta data for a failed page. The first bit indicates whether the bit valid, then the source inform is present using the next 7 bits to tell which page from the block failed, then the next 25 bits provide the destination address for the failed page. For each of the first five fields, if the meta data is "0", the 33 bits in each field are arranged the same as the first field whereby if there is a valid bit in the first bit of the field, the next 7 bits to identify which page of the block failed, and the final 25 bits to explain the destination.

The method of utilizing the meta data involves assuming that a simple journal mechanism is implemented. The method assumes uniform page failure rate across a memory range. If the page failure rate is not uniform across the memory range, then a non-uniform allocation matched to the distribution is used. The non-uniform allocation is calculated using a formula if the distribution can be curve fitted or need to be stored in a table if the distribution cannot be curve fitted. If it is assumed that the lower half of the memory range has a 1% page failure rate and the upper half of the memory range has a 0.5% page failure rate, then the spare management for the lower half range uses the parameter of 128 pages per block while the spare management for the upper half range uses the parameter of 256 pages per block. If the maximum amount of bad pages is set at 5 pages, then if there are more than five errors in an entire block, then the entire block is remapped. The meta data for the failed page number and all page remappings are kept for the block as well as any block remapping as part of the meta page for each block. This way, the meta data does not need to be separate global tables which would impose a huge access penalty as well as cost.

An SRAM can be used as a cache to speed the remapping process for the blocks with errors. The cache can selectively store remappings for the blocks with have errors where the number of errors is greater than 1, but less than the predetermined maximum number of pages with errors. The cache can be preordered so that the block addresses are sorted so that a binary search on identifying the faulty block addresses can be faster. The spare page that is mapped to the first faulty page of the block optionally can have a meta data bit to indicate the presence of caching for the specific block.

To initiate the method of using the meta data, a set of contiguous spare pages is allocated to remap defective pages. The addresses for the spare area will start from $2^{32}$ if the drive size is $2^{32}$. The spare area is not mapped to any LBA initially, and DWL output does not cover the address space. Having a contiguous set (or easily computable address sequences) of spare locations provides an assumption of the available spare locations. Bad pages are initially detected during write or read. For the first process, a bad page is encountered during a write process. The bad page is mapped deterministically to a spare page. Because no table is maintained, the read still goes to the bad page. The read will result in an error and therefore there is a need to go to a known spare page location where the page is mapped. For the second write to a bad page, a read of the bad page occurs to obtain an error and then the write is directed to the known spare page location. The number of errors for each block does not need to be maintained. Before allocated a spare page to a failed PBA, the spare page is read and verified that no other PBA is allocated thereto.

The controller makes a physical block of a predetermined size (i.e., 128 pages in one example) in the physical space. If the physical block is 128 pages and the drive size is 232 pages, then there are $2^{32}/2^7=2^{25}$ physical blocks. If any of the first 128 pages (i.e., from virtual block 1) has a defective page, the defective page is mapped to the first page of the spare area. The page index can be written as part of the meta data if there is any extra space in the parity die. Meta data is included as part of the ECC data, so ECC protection as well as RAID protection is available on the meta data. If there is not enough space in the parity die to write the meta data, the meta data is written as part of any or all of the dies. For example, assuming 64B user data is spread such that 8 bytes are written to 8 data dies, 60 bits are written to 1 parity die, there are only 4 bits remaining in the parity die to write any meta data. Since 4 bits is not sufficient to write 7 bits of meta data, 9 bytes of each die need to be allocated for a codeword in the spare PBA instead of 8 bytes for each codeword in the original PBA.

Mapping information for all of the errors of the block are stored in the spare page as part of meta data to enable quick access to the remapped bad pages. The number of accesses would then be limited to two when accessing a remapped page. The location of where a block is remapped will be stored if there are more than the predetermined number of page errors. The data is stored as part of the meta data. The first bad page from a physical block will always be mapped to the spare page. The spare page will contain meta data on any further page remappings corresponding to the physical block as well as block remapping for the physical block. It is easier to read the spare page always and update the meta data as needed. It is a good idea to keep the meta data in more than one copy (either by replicating the meta data section as a separate spare page or synching up the meta data of other allocated spare pages of the block). If there is a second bad page from the physical block, the second bad page is mapped to the second spare page. If there are more bad pages then the predetermined limit, the entire physical block is remapped to a new physical block from the spare area. A table may be maintained in the controller to perform the remapping for the blocks. The size of the table can be as large as 210 KB of memory with a SRAM depth of 33000 and width of 50 bits. The SRAM is preserved in the SCM as part of the meta data in case of power failure. Spare pages can be encoded with more powerful ECC as needed as the spare page would have user data and parity data and meta data. If the spare page itself becomes defective, then the spare page becomes mapped to another spare page.

The meta data of the failed page, the page remapping data for the block, and any block remapping is kept as part of the meta data of the first spare page allocated. This way, for the first page error out of a block, the failed page needs to be accessed followed by the first spare page allocated. For the second page error our of a block, access to the failed page is followed by the first spare page to get the meta data and then access to the second spare page. The meta data section of the first spare page in a block can be protected with stronger ECC as well for more duplication. The first spare page of a block is special as the first spare page contains the block level meta data as well as the data for the first failed page of the block.

Figure 7:
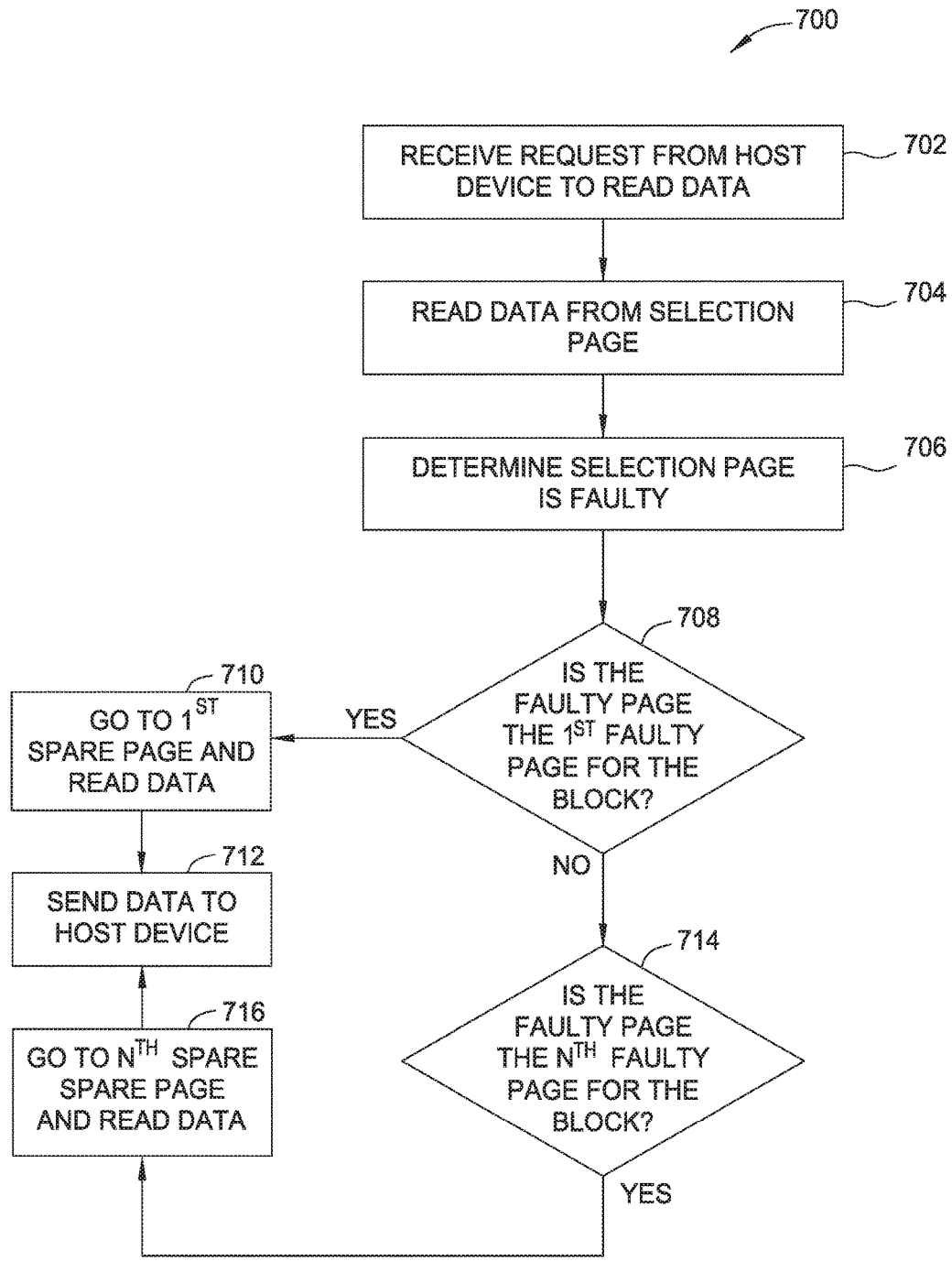
FIG. 7 is a flow chart of a read process using meta data without tables according to one embodiment.

FIG. 7 is a flow chart 700 of a read process using meta data without tables according to one embodiment. Initially, a read request is received from the host device 102 in block 702. Then, the memory system 104 reads the data from the selected page where the data is located in block 704. If the page is not a faulty page, then the data is delivered to the host device 102. If, however, the data is determined to be faulty in block 706, a determination is made as to whether the page is the first faulty page in the block in block 708. If the faulty page is the first faulty page in the block, then the data is located in the first spare page for the block and is read in block 710. The data is then delivered to the host device in block 712. If the faulty page is not the first faulty page of the block, there is a determination of whether the faulty page is the Nth faulty page of the block where N is less than or equal to the predetermined maximum number of faulty pages for the block. The data is then retrieved from the Nth spare page in block 716 and then delivered to the host device 102 in block 712. If there are more than N faulty pages, then the entire block is faulty and remapped. Thus, during the first read process, a determination will be made as to whether the entire block is faulty or whether simply the page itself is faulty.

Figure 8:
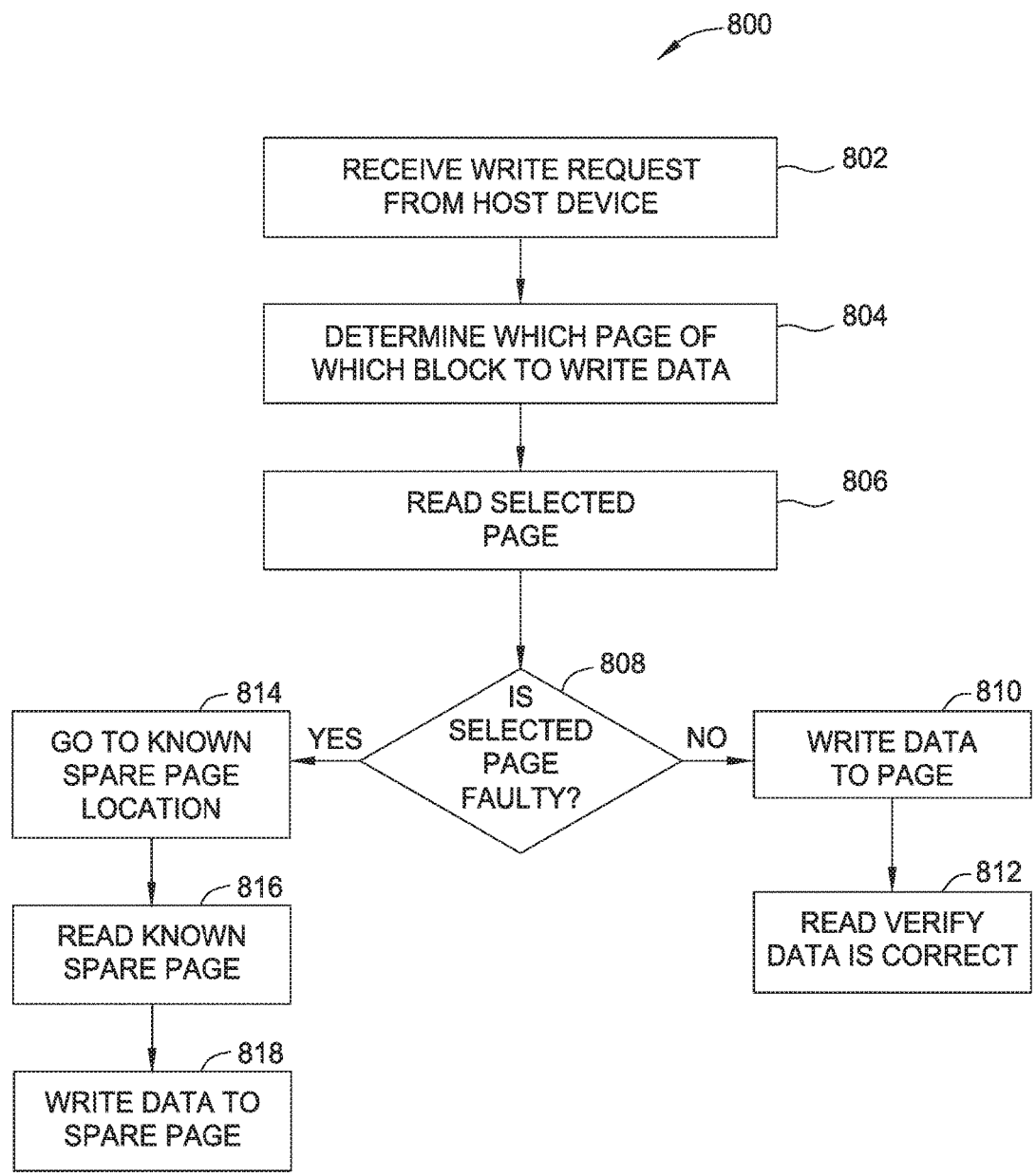
FIG. 8 is a flow chart of a write process using meta data without tables according to one embodiment.

FIG. 8 is a flow chart 800 of a write process using meta data without tables according to one embodiment. In the write process, an initial write request is received from the host device in block 802. Then, a determination is made in block 804 regarding which page of a particular block is to be used for writing the data. Then, the selected page is read in block 806. A determination is then made as to whether the selected page is faulty in block 808. If the block is not faulty, then data is written to the page in block 810 and finally a read verify is performed in block 812. If, however, the page is faulty, then the write is directed to a known spare page location in block 814 which is then read in block 816 to ensure the known spare page is not faulty and not already in use by another failed page. Assuming the spare page is neither faulty nor used by another page, the data is written to the spare page in block 818.

By using embedded pointers, hash functions and meta data stored in the bad pages of a memory device, tables can be avoided and efficient use of the memory device can occur. Each of the embedded pointers, hash function and meta data utilizes the faulty data pages and provides directions to a spare location where the actual data is stored. The directions are stored in the faulty pages themselves. Thus, no tables are necessary.

While the foregoing is directed to embodiments of the present disclosure, other and further embodiments of the disclosure may be devised without departing from the basic scope thereof, and the scope thereof is determined by the claims that follow.

What is claimed is:

1. A method, comprising:
receiving a request to read storage data from a storage page of a memory device, the storage page having a storage data and parity data;
reading the parity data from the storage page;
determining that the parity data indicates the storage page is faulty;
performing an error code correction decoding;
determining when the error code correction is a failure;
reading the storage data, wherein the storage data contains an embedded pointer;
decoding the storage data to determine a spare page location; and reading data from the spare page location, wherein the parity data includes a logical value of "0" for all parity bits and an error code correction failure indicates a bad page.

2. The method of claim 1, wherein the storage page contains ten die with each die having eight bytes.

3. The method of claim 2, wherein one die contains the parity data.

4. The method of claim 3, wherein one die contains ECC data.

5. A method, comprising:
receiving a request to read storage data from a storage page of a memory device, the storage page having the storage data and parity data;
reading the parity data from the storage page;
determining that the parity data indicates the storage page is faulty;
reading the storage data, wherein the storage data contains an embedded pointer;
decoding the storage data to determine a spare page location; and
reading data from the spare page location, wherein the storage page contains ten die with each die having eight bytes, wherein one die contains the parity data, and wherein the parity data includes a logical value of "0" for all parity bits.

6. A method, comprising:
receiving a request to read storage data from a storage page of a memory device, the storage page having the storage data and parity data;
reading the parity data from the storage page;
determining that the parity data indicates the storage page is faulty;
reading the storage data, wherein the storage data contains an embedded pointer;
decoding the storage data to determine a spare page location; and
reading data from the spare page location, wherein the parity data includes a logical value of "0" for all parity bits.

7. A computer system for storing and retrieving files, comprising:
a processor; and
a memory system storing instructions that, when executed by the processor, cause the computer system to:
receive a request to read storage data from a storage page of a memory device, the storage page having the storage data and parity data;
read the parity data from the storage page;
determine that the parity data indicates the storage page is faulty;
read the storage data, wherein the storage data contains an embedded pointer;
decode the storage data to determine a spare page location; and
read data from the spare page location wherein the storage page contains ten die with each die having eight bytes, wherein the parity data includes a logical value of "0" for all parity bits.

8. A computer system for storing and retrieving files, comprising:
a processor; and
a memory system storing instructions that, when executed by the processor, cause the computer system to:
receive a request to read storage data from a storage page of a memory device, the storage page having the storage data and parity data;
read the parity data from the storage page;
determine that the parity data indicates the storage page is faulty;
read the storage data, wherein the storage data contains an embedded pointer;
decode the storage data to determine a spare page location; and
read data from the spare page location, wherein the parity data includes a logical value of "0" for all parity bits.

9. A non-transitory computer readable storage medium, containing instructions that, when executed by a processor, cause a computer system to burn files after a read process has been completed, by performing the steps of:
receive a request to read storage data from a storage page of a memory device, the storage page having a storage data and parity data;
read the parity data from the storage page;
determine that the parity data indicates the storage page is faulty;
performing an error code correction decoding;
determining when the error code correction is a failure
read the storage data, wherein the storage data contains an embedded pointer;
decode the storage data to determine a spare page location; and
read data from the spare page location, wherein the parity data includes a logical value of "0" for all parity bits and an error code correction failure indicates a bad page.

10. The non-transitory computer readable storage medium of claim 9, wherein the storage page contains ten die with each die having eight bytes.

11. The non-transitory computer readable storage medium of claim 10, wherein one die contains the parity data.

12. The non-transitory computer readable storage medium of claim 11, wherein one die contains ECC data.

13. A non-transitory computer readable storage medium, containing instructions that, when executed by a processor, cause a computer system to burn files after a read process has been completed, by performing the steps of:
receive a request to read storage data from a storage page of a memory device, the storage page having the storage data and parity data;
read the parity data from the storage page;
determine that the parity data indicates the storage page is faulty;
read the storage data, wherein the storage data contains an embedded pointer;
decode the storage data to determine a spare page location; and
read data from the spare page location, wherein the storage page contains ten die with each die having eight bytes wherein one die contains the parity data, and wherein the parity data includes a logical value of "0" for all parity bits.

14. A non-transitory computer readable storage medium, containing instructions that, when executed by a processor, cause a computer system to burn files after a read process has been completed, by performing the steps of:
receive a request to read storage data from a storage page of a memory device, the storage page having the storage data and parity data;
read the parity data from the storage page;
determine that the parity data indicates the storage page is faulty;

read the storage data, wherein the storage data contains an embedded pointer;

decode the storage data to determine a spare page location; and read data from the spare page location, wherein the parity data includes a logical value of "0" for all parity bits.

15. A device, comprising:

means for receiving a request to read storage data from storage means of a memory device;

means for reading parity data and storage data from a storage page;

means for conducting an error code correction for the storage page;

means for determining that a parity data indicates the storage page is faulty;

means for reading an embedded pointer from storage data;

means for decoding the storage data to determine a spare page location; and means for reading data from the spare page location wherein the parity data includes a logical value of "0" for all parity bits and an error code correction failure indicates a bad page.

16. The device of claim 15, wherein the storage means comprises a plurality of die.

17. The device of claim 16, wherein one die contains the parity data.

18. The device of claim 17, wherein one die contains ECC data.

19. A device, comprising:

means for receiving a request to read storage data from storage means of a memory device;

means for reading parity data and storage data from the storage means;

means for determining that the parity data indicates the storage means is faulty;

means for reading an embedded pointer from storage data;

means for decoding the storage data to determine a spare page location; and means for reading data from the spare page location wherein the storage means comprises a plurality of die and wherein one die contains the parity data wherein one die contains ECC data wherein the parity data includes a logical value of "0" for all parity bits.

* * * * *